United States Patent [19]

Pechard

[11] 3,848,223

[45] Nov. 12, 1974

[54] CONNECTOR FOR PRINTED CIRCUIT BOARDS

[75] Inventor: Lucien Leon Pechard, Dole, France

[73] Assignee: Bunker Ramo Corporation, Oak Brook, Ill.

[22] Filed: Apr. 16, 1973

[21] Appl. No.: 351,537

[30] Foreign Application Priority Data

Apr. 20, 1972 France .............................. 72.14060

[52] U.S. Cl...... 339/176 MP, 339/64 M, 339/254 M

[51] Int. Cl. ............................................ H05k 1/07

[58] Field of Search...339/17 L, 17 LM, 64, 176 MF, 339/176 MP, 254, 255 R; 317/101 CC, 101 D, 101 DH

[56] References Cited

UNITED STATES PATENTS

| | | | |
|---|---|---|---|
| 3,530,422 | 9/1970 | Goodman | 339/176 MP X |
| 3,534,324 | 10/1970 | Dorn | 339/176 MP |
| 3,576,515 | 4/1971 | Frantz | 317/101 DH X |

FOREIGN PATENTS OR APPLICATIONS

| | | | |
|---|---|---|---|
| 231,923 | 4/1925 | Great Britain | 339/193 S |

*Primary Examiner*—Paul R. Gilliam
*Assistant Examiner*—Lawrence J. Staab
*Attorney, Agent, or Firm*—F. M. Arbuckle; N. Lesser

[57] ABSTRACT

A connector into which a printed circuit board can be inserted. The connector includes a grooved support for supporting and positioning the printed circuit board and a spherical contact adjacent the groove for making electrical contact with an electrical contact on the printed circuit board when the printed circuit board is inserted into the grooved support. The spherical contact is movable transversely with respect to the printed circuit board and is biased against the printed circuit board by a resilient element. A means coupled to the spherical contact is provided to limit and guide the motion of the spherical contact.

5 Claims, 6 Drawing Figures

PATENTED NOV 12 1974 3,848,223

SHEET 1 OF 2

CONNECTOR FOR PRINTED CIRCUIT BOARDS

BACKGROUND OF THE INVENTION

1. Field of the Invention

This invnetion relates to connectors for printed circuit boards, particularly to connectors for printed circuit boards designed to be inserted laterally into a connector.

2. Description of the Prior Art

Connectors for printed circuit boards are usually designed to permit direct plug-in type insertion of the printed circuit board (or of an intermediate strip) into a mating female type socket. Such prior art connectors required considerable space and were useful only with circuit boards having contacts on one edge of the circuit board. Additionally, when prior art connectors are utilized, the accessibility of the circuit board is limited.

SUMMARY OF THE INVENTION

It is an object of the invention to provide an improved connector for circuit boards which allows lateral insertion of a circuit board into the connector.

According to the invention, a ball forms the contact point for each connection of a connector. The electrical terminal of the connector is electrically coupled to the ball through a spring which also biases the ball against the printed circuit board.

The printed circuit board has conductive regions which contact the mating balls when the circuit board is inserted into its proper position. The configuration according to this invention allows a circuit board to be inserted laterally into the connector. Prior to insertion of the circuit board into the connector, the contact balls are biased by the spring into the path of insertion. During lateral insertion of the circuit board, the balls are depressed as they come into contact with the edge of the circuit board which may be chamfered to facilitate the insertion of the board and the movement of the balls.

The connector can also be used for direct (plug-in type) insertion of a circuit board from one edge of the circuit board.

In order to increase the capacity of the connector, a double-face circuit board (an insulating board having circuits on both faces) can be used. For such double-face boards, the connector is provided with two rows of ball contacts on opposite sides of an insertion groove. Also a second row (or pair of rows) can be positioned on an opposite edge of the board to be contacted by a second connector into which the board is transversely inserted.

The connector of the present invention can be made very thin so as to require very little space, while at the same time offering the advantages typical of prior art connectors.

BRIEF DESCRIPTION OF THE DRAWINGS

Other characteristic features and advantages of the present invention can be inferred from the following description to be considered with reference to the appended drawings which show a preferred embodiment as an example of the present invention.

As shown in FIGS. 1 and 4, the connector for printed circuit boards comprises a resiliently mounted ball contact or contact member 1 (spherical member or ball) which establishes contact with side P of the printed circuit board. An electric connection between one of the external terminals 2 of the connector and the circuit board is obtained by means of a spring 3 which also provides a biasing force for the contact member or ball contact 1.

Figure 1:
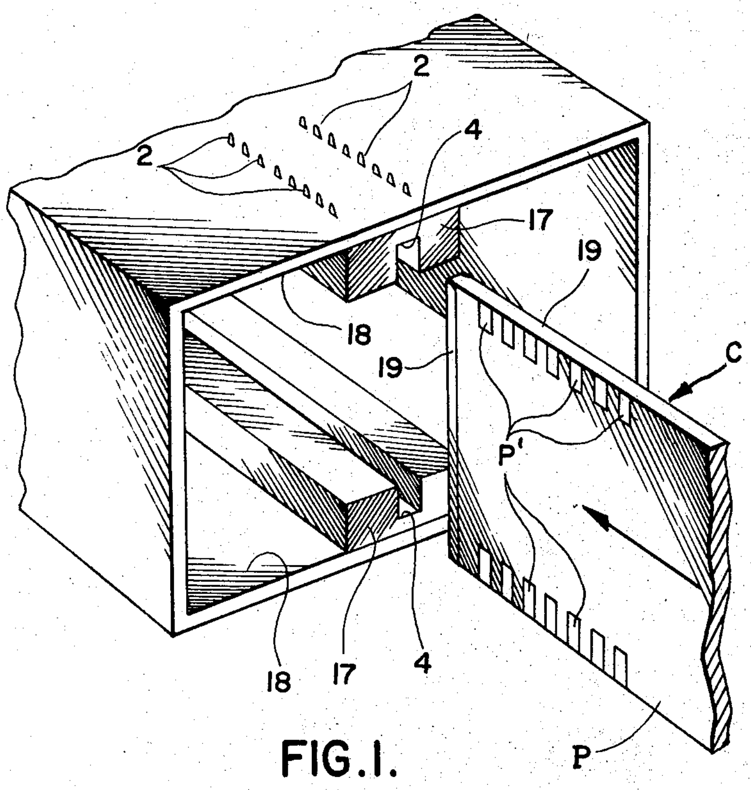
FIG. 1 is a perspective view of a drawer-like embodiment of the subject invention into which a printed circuit board is being inserted, the board carrying connecting contacts at opposite edges.

Printed circuit board C having a plurality of spaced contacts P′ carried along an edge thereof is inserted into groove 4 of positioning body member or block 17, with the ball located in one side of the groove. A row of such balls may be provided on one side of groove 4 to come into contact with various electrical contacts P′ of printed circuit board C.

Each of balls 1 is resiliently mounted by means of a spring 3 and guided in its motion perpendicular to the side of groove 4 either in a direction F1 toward groove 4 or in an opposite direction F away from groove 4 by a carrier or carrier member 5 (intermediate guiding member).

In the illustrated embodiment of the invention, carrier 5 comprises a forked seat 6 which embraces the ball with lips 7. Sections 5*a* of carrier 5 glide on the walls 8*a* of a guiding chamber 8.

Spring 3, which is a compression coil spring in the embodiment under consideration, extends over two opposing lugs 9 on carrier 5. One end of spring 3 rests on a bearing surface 10 of carrier 5, while the other end rests on a similar bearing surface 11 of extension 12 of terminal 2 fixed in the body member. Carrier 5 traverses extension 12 of terminal 2 through an passageway or opening 13 in the extension, and an extension 14 of carrier 5 bears either against rear wall 15 of chamber 8 or against one side 16 of extension 12 of terminal 2, in order to restrict the motion of the ball in one direction F1 and in the opposite direction F. As may easily be seen from the drawings, the spring 3 biases the respective ball contact into the groove and establishes an electrical connection from a respective printed circuit contact and ball contact to the terminal 2 fixed in body member 17 without requiring a soldered connection to the terminal 2.

Two rows of ball connectors can be provided on the two opposite sides of groove 4 in the positioning block 17. Then, single-face or double-face printed circuit boards can be inserted into the connector.

Corresponding connectors can be provided in opposite positions on the interior surfaces 18 of a drawer-like housing. Groove 4 of one of positioning block 17 is then located exactly opposite and parallel to groove 4 of the other positioning block.

Figure 2:
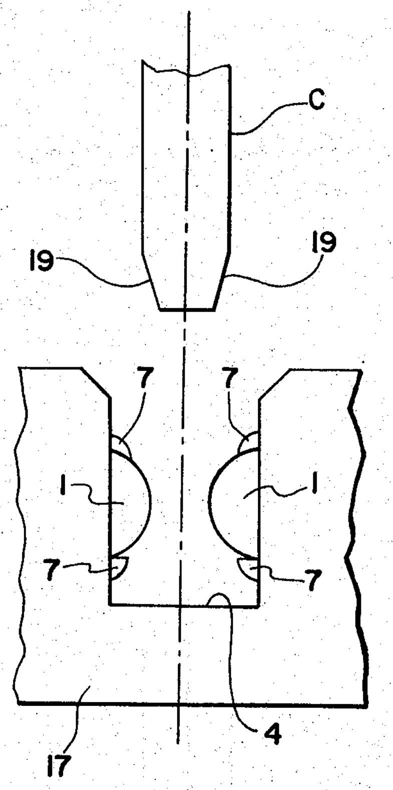
FIG. 2 shows a circuit board being inserted directly (in the conventional manner) into a connector according to the invention.
Figure 3:
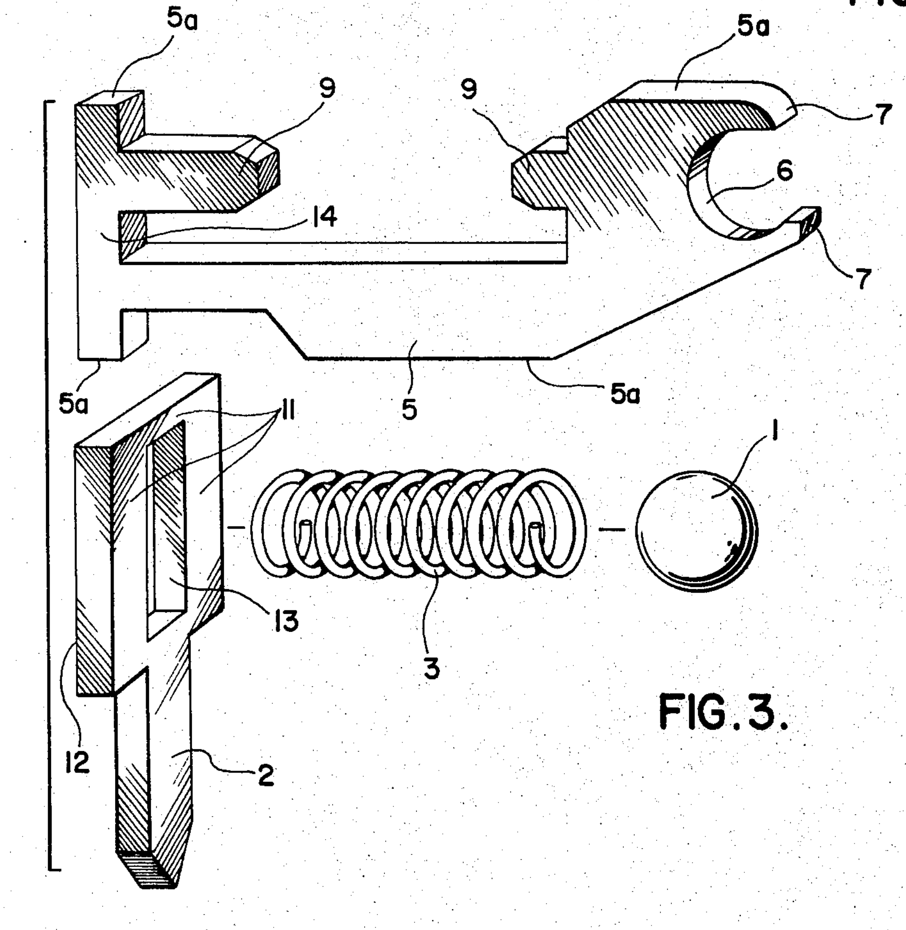
FIG. 3 is an exploded perspective view of the ball and related elements of the invention.
Figure 4:
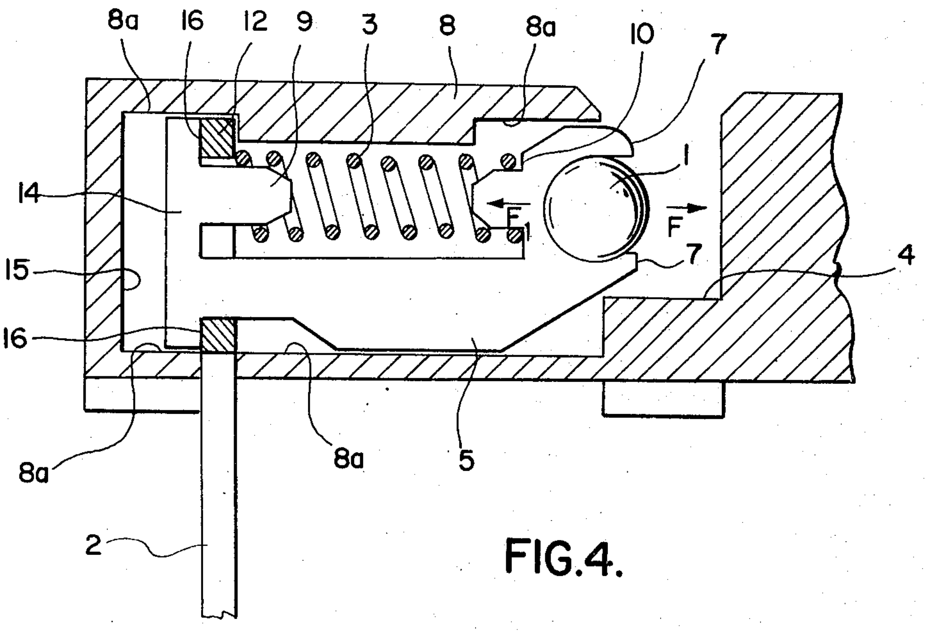
FIG. 4 is a cross-sectional side view of the assembled components.

When only one block is provided, the single-face or double-face board is plugged directly into the groove as shown in FIG. 2.

In order to facilitate both lateral and direct (plug-in or single-side) insertion, circuit board C may be provided with a double chamfer 19.

Figure 5:
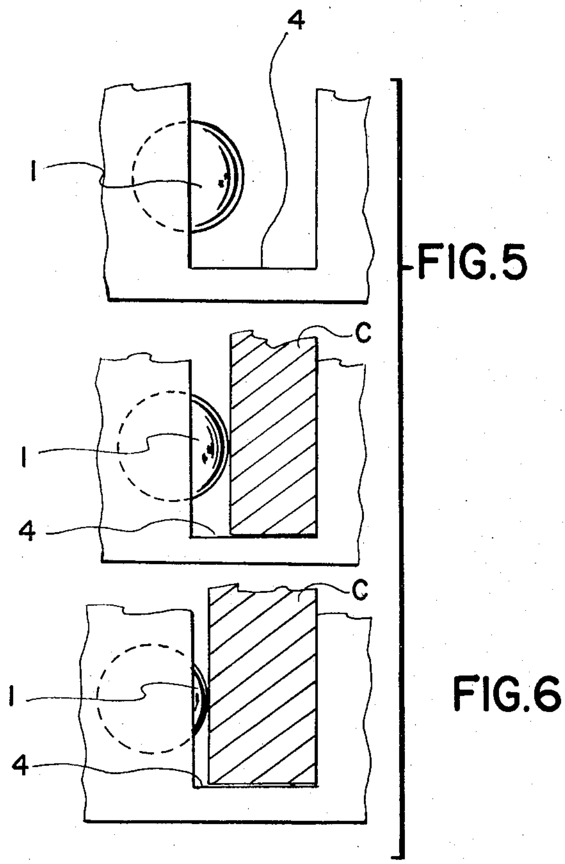
FIG. 5 shows side views of a single-face connector prior to insertion of a circuit board, and after insertion of circuit boards of different thicknesses.

FIG. 5 shows three side views of positioning block 17 with a groove 4 carrying a row of balls 1 on one side only. In one view, the positioning block is shown without an inserted circuit board and in the other views with boards of various thicknesses inserted.

Figure 6:
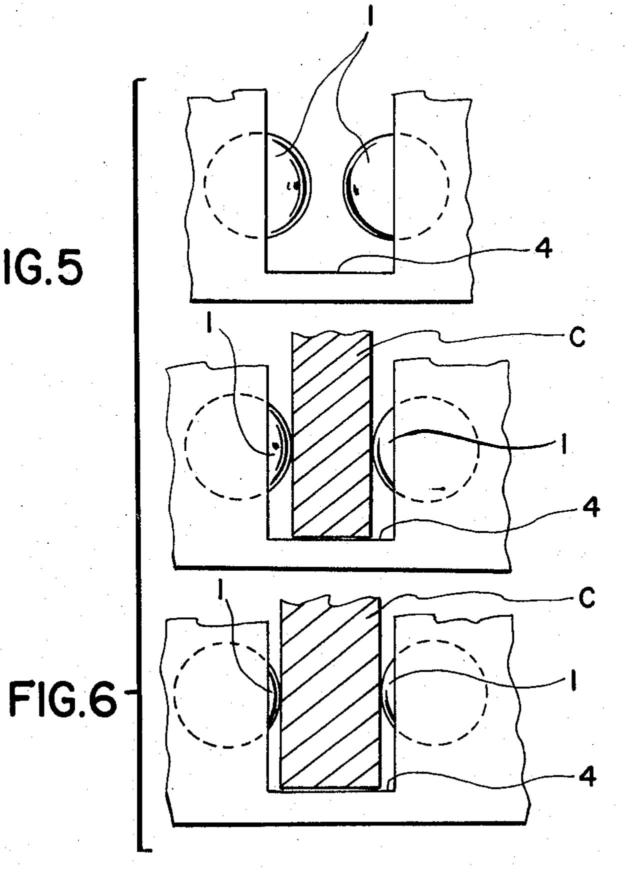
FIG. 6 shows side views of a double-face connector prior to insertion of a circuit board; and after insertion of circuit boards of different thicknesses.

Similarly, FIG. 6 shows a positioning block 17 whose groove 4 carries a row of balls 1 on each side. The block is shown without an inserted circuit board and with boards of various thicknesses inserted.

In other embodiments of the present invention, the spring can be given any appropriate form which allows insertion of the spring between bearing surface 10 of carrier 5 and bearing surface 11 of extension 12 of terminal 2.

Similarly, the ball can be mounted on the spring itself to provide direct guiding of the ball in an opening whose diameter corresponds to the dimensions of the ball so that a separate carrier 5 is not required.

The ball can form only a portion of a sphere, i.e., a spherical cap of appropriate height can be employed.

From the foregoing, it can be readily realized that this invention can assume various embodiments. Thus, it is to be understood that the invention is not limited to the specific embodiments described herein, but is to be limited only by the appended claims.

The embodiments of the invention in which an exclusive property or privilege is claimed are defined as follows:

1. A connector for establishing a respective electrical connection to each of a plurality of spaced contacts carried by and adjacent one edge of a printed circuit board comprising:

a body member having a groove extending longitudinally along said body member for receiving said spaced contacts and the one edge of said printed circuit board;

a ball contact for each spaced contact;

a carrier member for each ball contact carrying the respective ball contact for rotation about the center of the respective ball contact and for movement with the respective carrier member transversely to said groove for enabling each ball contact to be moved into said groove for engaging a respective spaced contact on said printed circuit board; and means for biasing each carrier member and the respective ball contact carried by each carrier member toward said groove with the spherical configuration of each ball contact projecting into said groove for engaging a respective one of the spaced contacts on the printed circuit board in response to the receipt of said spaced contacts and the one edge of said printed circuit board in said groove.

2. The connector as claimed in claim 1, including:

an electrical terminal fixed in said body member, and wherein said biasing means comprises a conductive coil spring with one end of said coil spring engaging said carrier member and the other end of said spring engaging said electrical terminal whereby said spring electrically couples said one ball contact to said electrical terminal without solder and biases the respective carrier member and said one ball contact toward said groove.

3. The connector as claimed in claim 2, in which said terminal has a passageway and the respective carrier member has a portion received into said passageway for guiding the movement of the respective carrier member transversely to said groove.

4. A connector for establishing an electrical connection to a contact carried by and adjacent one edge of a printed circuit board;

a body member having a groove for receiving the one edge and the spaced contacts carried by said printed circuit board;

at least, one contact member mounted in said body member to resiliently project into said groove, said contact member having a spherical configuration for engaging said board and said contact in response to the receipt of said board and said contact in said groove;

a resilient element formed separately from and coupled to said contact member for biasing said contact member against said board and contact;

an electrical terminal;

said resilient element including a conductive spring electrically coupling said contact member to said electrical terminal; and a carrier for said contact member and positioned adjacent said groove, said contact member being carried on one end of said carrier for lateral movement with said carrier in a direction into and out of said groove;

said one end of said carrier including a forked seat embracing a portion of said contact member.

5. A connector for establishing an electrical connection to a contact carried by and adjacent one edge of a printed circuit board, comprising:

a body member having a groove for receiving the one edge and contact of said printed circuit board; at least, one contact member mounted in said body member to resiliently project into said groove, said contact member having a spherical configuration from engaging said board and the contact carried by said board in response to the receipt of said board and contact in said groove;

a resilient element formed separately from and coupled to said contact member for biasing said contact member against said board and contact;

an electrical terminal;

said resilient element including a conductive spring electrically coupling said contact member to said electrical terminal;

a carrier for said contact member and positioned adjacent said groove, said contact member being carried on an end of said carrier for lateral movement with said carrier in a direction into and out of said groove;

said electrical terminal including an extension adjacent an end opposite said first mentioned end of said carrier, and said spring comprises a compression spring located between said carrier and said extension;

said body member including a chamber intersecting said groove, said carrier being located in and guided by the walls of said chamber; and the lateral movement of said carrier in one direction is limited by said opposite end of said carrier abutting against a wall protion of said chamber and the lateral movement of said carrier in the opposite direction is limited by the abutting of a portion of said opposite end of said carrier against said extension of said terminal.

* * * * *